United States Patent [19]

Kitamura

[11] Patent Number: 5,659,565
[45] Date of Patent: Aug. 19, 1997

[54] SEMICONDUCTOR OPTICAL DEVICE WITH MESA STRUCTURE WHICH IS SURROUNDED LATERALLY BY INSULATING MASK FOR PREVENTING CURRENT FROM LEAKING DIRECTLY FROM CLADDING LAYER TO SUBSTRATE AND PROCESS OF FABRICATION THEREOF

[76] Inventor: Shotaro Kitamura, c/o NEC Corporation, 7-1, Shiba 5-chome, Minato-ku, Tokyo, Japan

[21] Appl. No.: 280,680

[22] Filed: Jul. 27, 1994

[30] Foreign Application Priority Data

Jul. 29, 1993 [JP] Japan ................. 5-187803

[51] Int. Cl.[6] ........................................ H01S 3/18
[52] U.S. Cl. ................................ 372/43; 372/46
[58] Field of Search ........................ 372/43, 46, 50

[56] References Cited

U.S. PATENT DOCUMENTS

| 4,077,817 | 3/1978 | Bellavance . | |
|---|---|---|---|
| 5,237,639 | 8/1993 | Kato et al. | 372/43 |
| 5,383,216 | 1/1995 | Takemi | 372/50 |

FOREIGN PATENT DOCUMENTS

| 0 312 401 | 4/1989 | European Pat. Off. . | |
|---|---|---|---|
| 0 433 051 | 6/1991 | European Pat. Off. . | |
| 0 525 779 | 2/1993 | European Pat. Off. . | |
| 0094389 | 5/1986 | Japan | 372/46 |
| 0227586 | 10/1991 | Japan | 372/43 |
| 5-37092 | 2/1993 | Japan . | |
| 5110186 | 4/1993 | Japan | 372/43 |

OTHER PUBLICATIONS

T. Sasaki et al., "Tunable DBR Laser Diodes with Selectively Grown Waveguide," Opto–Electronics Research Labs., NEC Corporation (1991). (No Month Available).

T. Kato et al., "Novel MQW–DBF–LD/Modulator Integrated Light Source Fabricated by Bandgap Energy Controlled MOVPE Selective Regrowing Technique," Opto–Electronics Research Labs., NEC Corporation (1991). (No Manth Available).

T. Sasaki et al., "Selective MOVPE Growth for Photonic Integration Circuits," OFC/IOOC '93 Technical Digest (1993), pp. 210–212. (No Month Available).

S. Kitamura et al., "Polarization–Insensitive Semiconductor Optical Amplifier Array Grown By Selective MOVPE," Opto–Electronics Research Labs., NEC Corporation. (No date Available).

T. Kato et al., "DFB–LD/Modulator Integrated Light Source by Bandgap Energy Controlled Selective MOVPE," Electronic Letters, vol. 28, No. 2 (Jan. 16, 1992), pp. 153–154.

Y. D. Galeuchet et al., "GaInAs/InP Selective Area Metalorganic Vapor Phase Epitaxy for One–Step–Grown Buried Low–Dimensional Structures," Journal of Applied Physics, vol. 68, No. 2 (Jul. 15, 1990), pp. 560–568.

Primary Examiner—Rodney B. Bovernick
Assistant Examiner—Yisun Sang

[57] ABSTRACT

A semiconductor mesa structure including active, absorbing, or passive guide layer is surrounding laterally by insulating mask, and is buried by a cladding layer which extends over the insulating mask, and injected current flows through the cladding layer into the mesa structure without leakage from the cladding layer into a substrate so that the semiconductor optical device is improved in performance.

2 Claims, 11 Drawing Sheets

SEMICONDUCTOR OPTICAL DEVICE WITH MESA STRUCTURE WHICH IS SURROUNDED LATERALLY BY INSULATING MASK FOR PREVENTING CURRENT FROM LEAKING DIRECTLY FROM CLADDING LAYER TO SUBSTRATE AND PROCESS OF FABRICATION THEREOF

FIELD OF THE INVENTION

This invention relates to a semiconductor optical device and, more particularly, to a semiconductor optical device which is fabricated by selective MOVPE technique and its fabrication process.

DESCRIPTION OF THE RELATED ART

In the selective MOVPE, two stripe masks with a center spacing is first patterned on a surface of a semiconductor substrate. The center spacing is by way of example, 2 microns. On the exposed center spacing between the stripe is epitaxially grown a semiconductor masks mesa structure including an active layer, a wave-guide layer or an optical absorbing layer. This selective MOVPE technique has better reproducibility in forming mesa structure than conventional fabrication technique which employs semiconductor etching.

The composition of the epitaxially grown semiconductor material varies depending on the stripe mask width, and this phenomenon is available for changing the energy band gap in the mesa structure. This technology is called as "band-gap controlling technology".

The following papers report semiconductor optical devices fabricated through the selectively growing technique.

(1) "Tunable DBR Laser Diodes with selectively Grown Waveguide" reported by Tatsuya SASAKI et al, C-134, Proceedings of 1991 Autumn Meeting of Electronic Information Communication Society.

(2) Japanese Patent Publication of Unexamined Application No. 5-37092.

(3) "Novel MQW-DFB-LD/Modulator Integrated Light Source" reported by Tomoaki KATO et al, C-133, Proceedings of 1991 Autumn Meeting of Electronic Information Communication Society.

Sasaki et al disclose three-terminal variable wavelength DBR laser diodes, and the band-gap controlling technology is available for simultaneously growing an active layer and a passive wave guide of the three-terminal variable wavelength DBR laser diode. The entire surface of the structure is covered with a cladding layer. Sasaki et al achieved the light output power 15 mill-watt around 1.55 micron wavelength with the three-terminal variable wavelength DBR laser diode, and the wavelength was varied over 2.2 nanometer band-width.

Kitamura discloses a semiconductor optical amplifier or an LD amplifier in Japanese Patent Publication of Unexamined Application No. 5-37092, and the selectively growing technology is applied to patterning stage of the active layer. The active layer is as narrow in width as 4000 angstroms, and is reproducible. Such a narrow active layer is hardly patterned through the conventional etching process. According to the Japanese Patent Publication of Unexamined Application, the semiconductor optical amplifier achieved the optical gain at 20 dB and a deflection dependency, i.e., the deviation of the optical gain in terms of deflection of incident light at 1.5 dB.

Kato et al reports an MQW-DFB-LD/modulator integrated light source, and the band-gap energy controlling technology is applied to simultaneous growth of the active layer and the light absorbing layer covered with the cladding layer in the MQW-DFB-LD/modulator integrated light source. The MQW-DFB-LD/modulator integrated light source achieved a laser oscillation with the wavelength of 1.55 micron at the light output of 1.8 mill-watt, and the extinction ratio was 22 dB at 2 volts. All of the semiconductor optical devices discussed above are BH structure where the light absorption layers, passive wave guide layers or active layers are buried in semiconductor materials.

FIGS. 1A to 1D illustrate the prior art process sequence for fabricating a semiconductor laser oscillator, a semiconductor light amplifier (or an LD amplifier) or a light modulator, and the band-gap controlling technology is incorporated in the prior art process sequence. In FIGS. 1A to 1D, the cross section is perpendicular to [011] orientation or the longitudinal direction of the semiconductor optical device.

The prior art process sequence starts with an n-type semiconductor substrate 1 of indium phosphide, and (100)-oriented surface serves as the major surface for the optical device. On the major surface of the n-type semiconductor substrate 1 is formed a stripe mask 2 of silicon oxide which is 1000 angstroms in thickness and 10 microns in width. The stripe mask 2 is separated into two parts 2a and 2b by a spacing and the spacing is 2 microns wide.

Using the selective MOVPE technique, a buffer layer 3, an active layer 4 and a cladding layer are epitaxially grown on the exposed spacing area and form a mesa stripe. The active layer 4 is indium gallium arsenide phosphide layer of 1.55 micron wavelength composition, and is 2000 angstroms thick. The resultant structure of this stage is illustrated in FIG. 1A.

The mask 2 on both sides of the mesa stripe is partially removed so that the exposed area is spread on both sides of the mesa stripe as shown in FIG. 1B.

The selective MOVPE technique is employed again, and a cladding layer 6 and a cap layer 7 are grown over the mesa stripe on the exposed area as shown in FIG. 1C. The mesa stripe is buried in the cladding layer 6. The cladding layer 6 is formed of p-type indium phosphide, and is 1.5 micron thick. The cap layer 7 is formed of heavily doped p-type indium gallium arsenide, and is 2000 angstroms thick.

1000 angstroms thick silicon dioxide is deposited on, and the silicon dioxide layer is partially removed so as to expose the top surface of the cap layer 7. The silicon dioxide layer and the mask 2 form passivation layer 8 covering the semiconductor optical device except for the cap layer 7.

Finally, 4000 angstroms thick gold and 500 angstroms thick titanium are deposited so as to form an electrode 9, and the resultant structure of this stage is illustrated in FIG. 1D.

The substrate 1 of n-type indium phosphide and the cladding layer 6 of p-type indium phosphide form a homo-junction 10 therebetween. The substrate 1 and the cladding layer 6 at the homo-junction 10 are of the order of $5 \times 10^{17}$ $cm^3$ in standard semiconductor optical devices.

If the electrode 9 is positively biased with respect to the substrate 1, current flows from the electrode 9 through the cap layer 7, the cladding layer 6, the cladding layer 5, the active layer 4, the buffer layer 3 into the substrate 1, and the active layer 4 generates laser light.

If the substrate is the p-type, the cladding layers 5 and 6 and the cap layer 7 are doped with n-type dopant impurity, and the buffer layer 3 is the p-type. As a result, the current flows in the opposite direction.

The prior art process sequence is applicable to an electroabsorption modulator which uses the Franz-Keldysh effect, and the active layer 4 is replaced with a light absorption layer.

The semiconductor optical device disclosed in the paper (1) has a waveguide in serial to the active layer 4, and the semiconductor optical device disclosed in the paper (3) further has a light absorbing layer in serial to the active layer 4. These waveguide and the light absorbing layer are formed through the band gap controlling technology, and the stripe-shaped masks disclosed in the papers (1) and 3 and the Japanese Patent Publication of Unexamined Application are oriented to [011] direction.

The prior art semiconductor optical devices encounter a problem in output characteristics. For example, the prior art semiconductor laser oscillator hardly achieves the light output exceeding 50 milli-watt, and the semiconductor light amplifier can not achieve the light output exceeding 25 dB. This is because of the fact that the mesa-shaped structure is buried in the cladding layer 6, and the injected current partially flows across the homo-junction directly between the cladding layer 6 and the semiconductor substrate 1 without passing through the active layer 4.

The prior art semiconductor light modulator is also affected by the homo-junction 10. As described hereinbefore, the standard doping level of the substrate 1 and the cladding layer 6 near the homo-junction are of the order of $5 \times 10^{17}$ cm$^{-3}$. The total amount of parasitic capacitance including the capacitance at the electrode 9 is equal to or greater than 3 pF, and does not allow the modulation bandwidth more than 2.4 GHz. In order to achieve the band width 2.4 GHz, the total amount of parasitic capacitance should be not greater than 2 pF.

Moreover, a problem is encountered in the prior art process sequence in complexity. This is because of the fact that the two selective MOVPE steps and the two mask patterning steps are incorporated in the prior art process sequence.

SUMMARY OF THE INVENTION

It is therefore an important object of the present invention to provide a semiconductor optical device which is improved in characteristics.

It is another important object of the present invention to provide a process of fabricating a semiconductor optical device which is less complex rather than the prior art process sequence.

To accomplish the first object, the present invention proposes to isolate a cladding layer 21 overlain by a cap layer 22 from a semiconductor substrate 23 by an insulating mask layer 24 laterally surrounding a mesa structure 25 including a buffer layer 26 and an active layer 27 as shown in FIG. 2.

The present inventor fabricated the semiconductor optical device shown in FIG. 2 through the prior art selective MOVPE technology, the selective MOVPE technology formed a cladding layer 21a and a cap layer 22a having a peak 28 as shown in FIG. 3. The present inventor contemplated the undesirable peak 28, and concluded that the insulating mask 24 oriented to [011] direction had resulted in the undesirable peak 28. In detail, if a mesa 31 was selectively grown on an exposed center spacing 35a in the insulating mask 33 which is oriented to [011] direction, the mesa 31 firstly grew in a direction A vertical to the major surface of the semiconductor substrate 32, and had a flat top surface as shown in FIG. 4A. However, the mesa 31 thereafter grew in a direction B, and formed side surfaces 31b of (111) orientation merged at the peak 34 as shown in FIG. 4B to 4D.

The peak 28 is not desirable, because an electrode requires a flat top surface of the cap layer.

To accomplish the second object, the present invention proposes to decline an exposed center spacing at least 5 degrees with respect to [011] direction. The present inventor confirmed the effect of the present invention. A semiconductor substrate 41 was exposed on the spacing between the insulating mask 42 obliquely extending at least 5 degrees with respect to [011] direction, a mesa 43 kept a trapezoid cross section through a selective MOVPE as shown in FIGS. 5A to 5C.

In accordance with one aspect of the present invention, there is provided a semiconductor optical device fabricated on a semiconductor substrate, comprising: a) an insulating stripe mask with a exposed center spacing; b) a mesa structure grown on the center spacing so that the insulating stripe mask is held in contact with a lower portion of the mesa structure; c) a cladding and cap layer grown from the mesa structure, and extending on an upper surface of the insulating mask; and d) electrode means for supplying current through the cladding layer to the mesa structure so that the mesa structure achieves an optical function.

In accordance with another aspect of the present invention, there is provided a process of fabricating a semiconductor optical device, comprising the steps of: a) preparing a semiconductor substrate having (100) orientation surface; b) providing an insulating masks with a stripe center spacing on the major surface, obliquely extending at 5 degrees or more than 5 degrees with respect to [011] direction of the crystal structure; c) forming a mesa structure grown on the center spacing so that the insulating masks are held in contact with a lower portion of the mesa structure; d) forming a cladding and cap layer grown from the mesa structure and extending on an upper surface of insulating mask, the cap layer having a flat top surface; and e) forming an electrode electrically connected to the cap layer for supplying current through the cladding layer to the mesa structure.

BRIEF DESCRIPTION OF THE DRAWINGS

The features and advantages of the semiconductor light device and the process of fabrication thereof according to the present invention will be more clearly understood from the following description taken in conjunction with the accompanying drawings in which.

DESCRIPTION OF THE PREFERRED EMBODIMENTS

First Embodiment

Figure 1A:
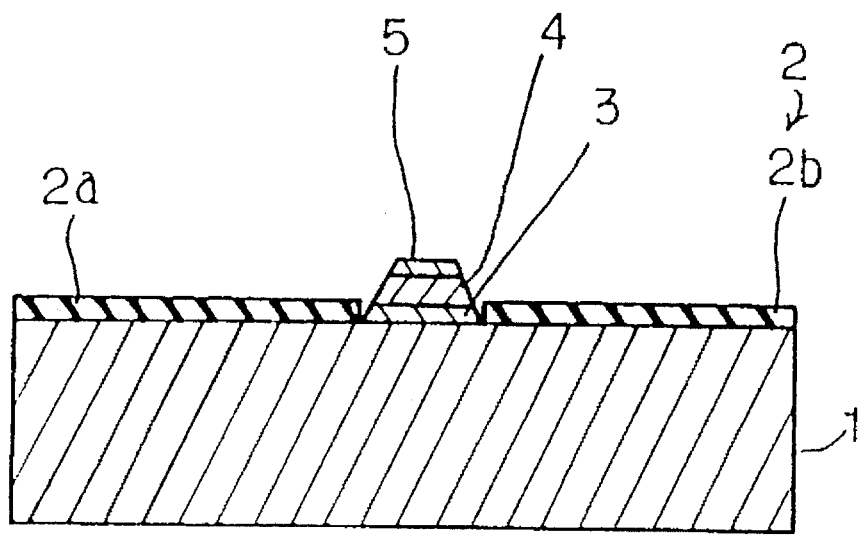
FIGS. 1A to 1D are cross sectional views showing the prior art process sequence for controlling the band-gap in the mesa structure.
Figure 1B:
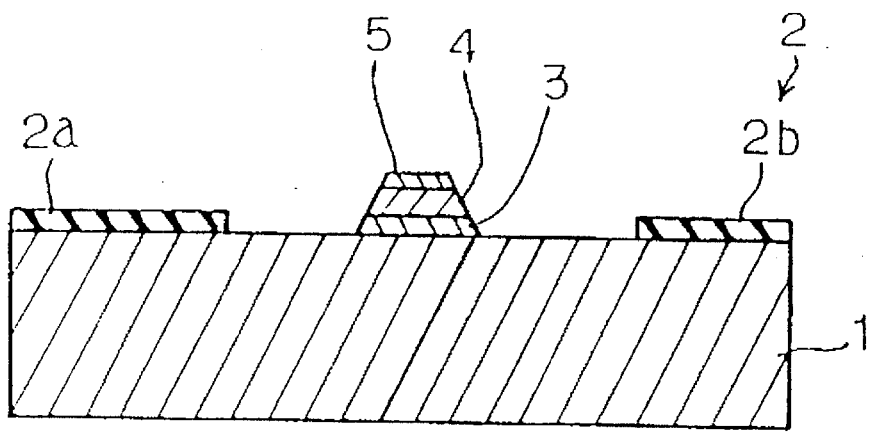
Figure 1C:
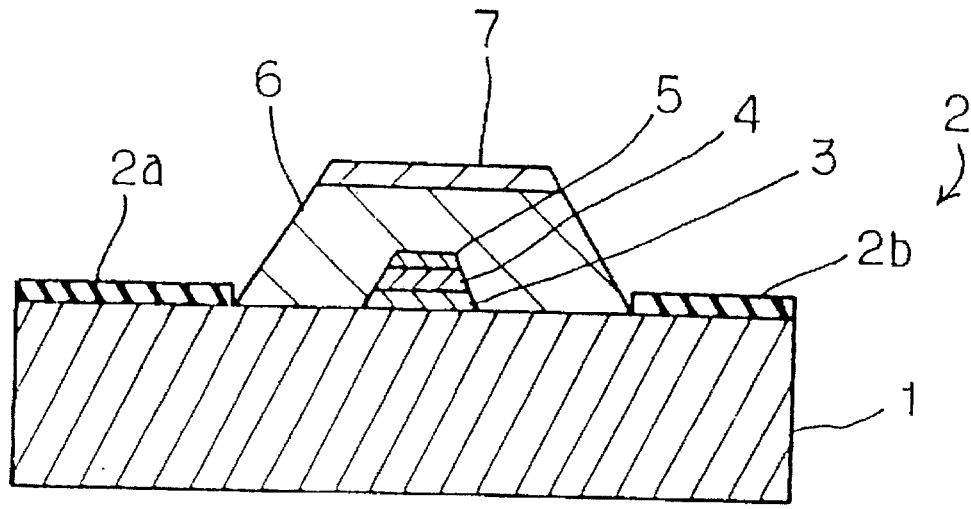
Figure 1D:
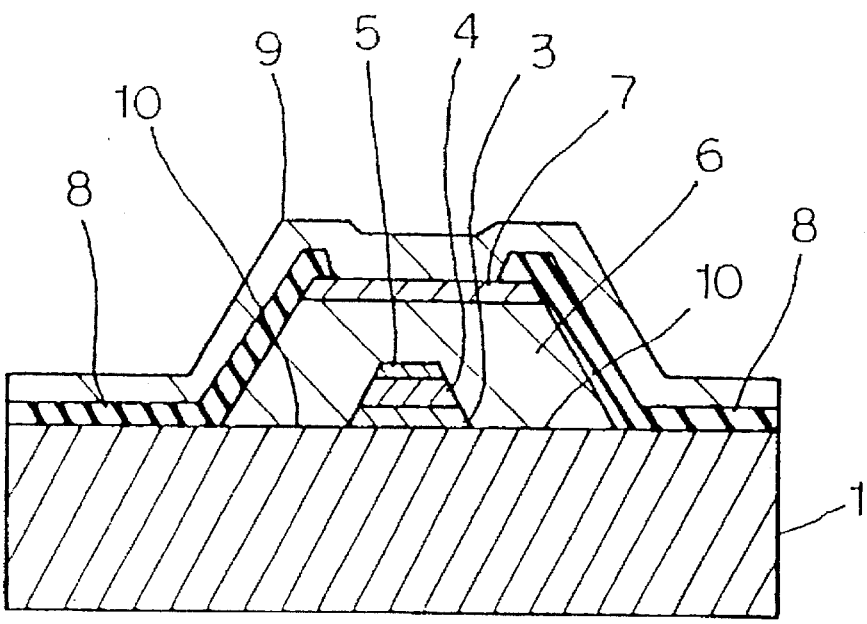
Figure 2:
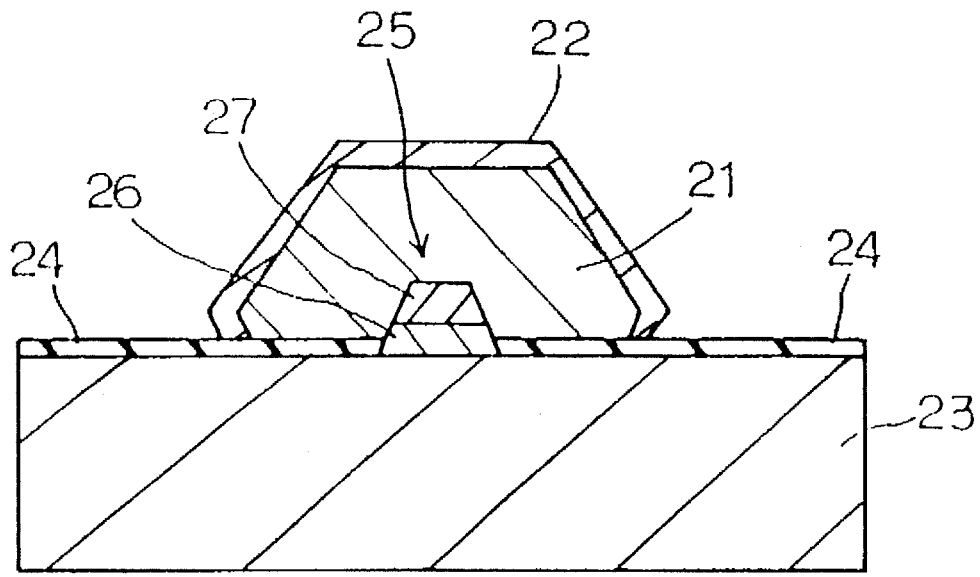
FIG. 2 is a cross sectional view showing the structure of a semiconductor optical device according to the present invention.
Figure 3:
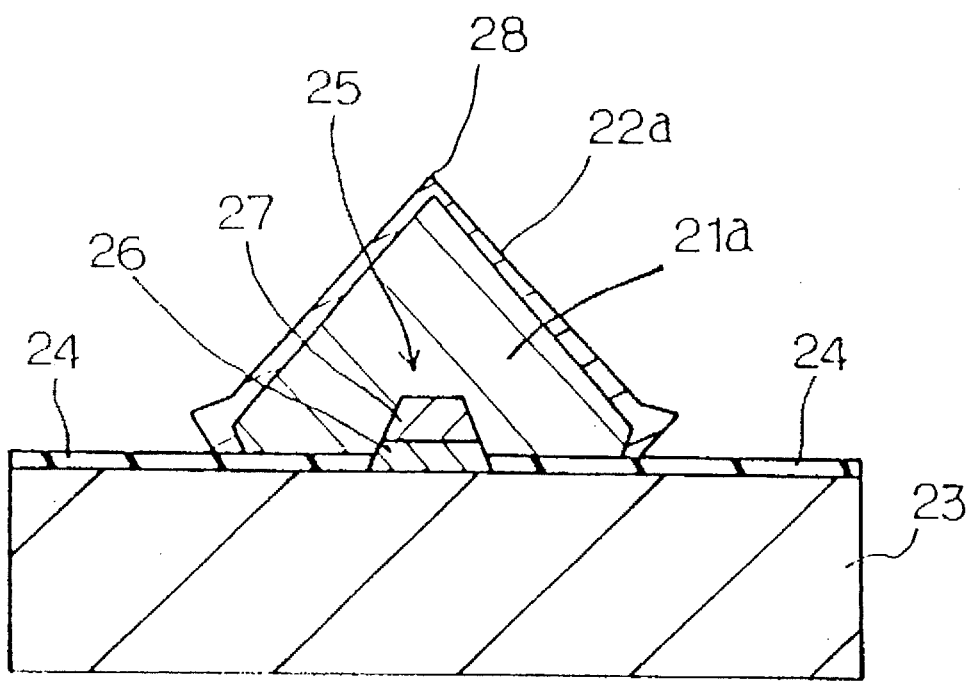
FIG. 3 is a cross sectional view showing the structure of a semiconductor optical device fabricated through the prior art process sequence.
Figure 4A:
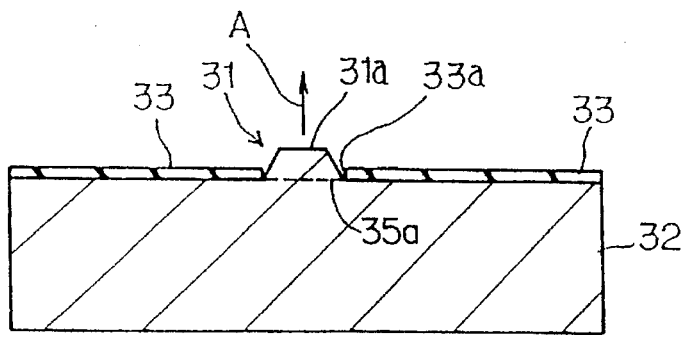
FIGS. 4A to 4D are cross sectional views showing the mesa grown on the exposed center spacing between the insulating masks oriented to [011] direction.
Figure 4B:
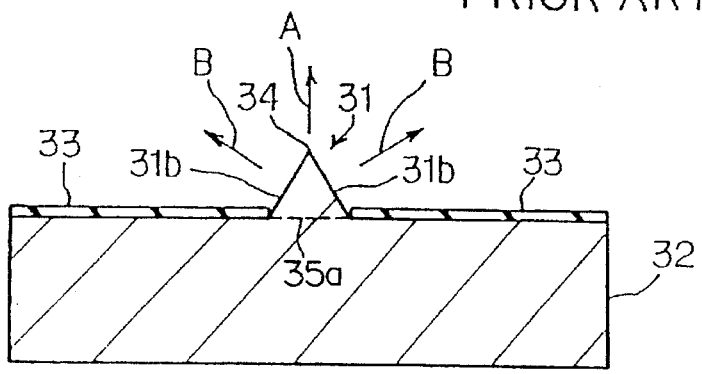
Figure 4C:
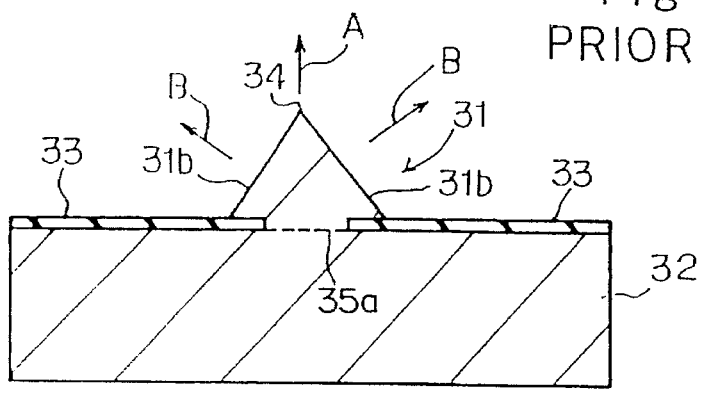
Figure 4D:
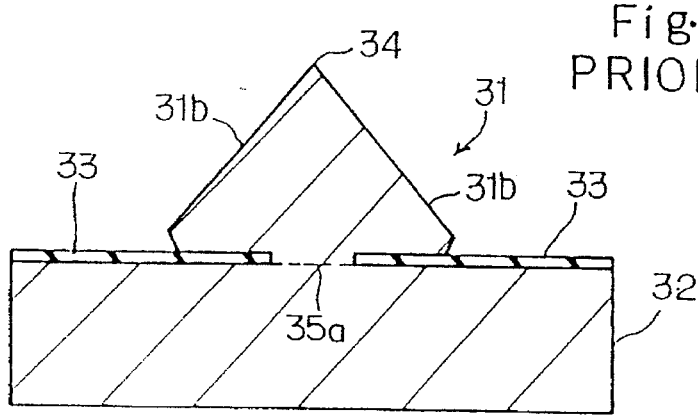
Figure 5A:
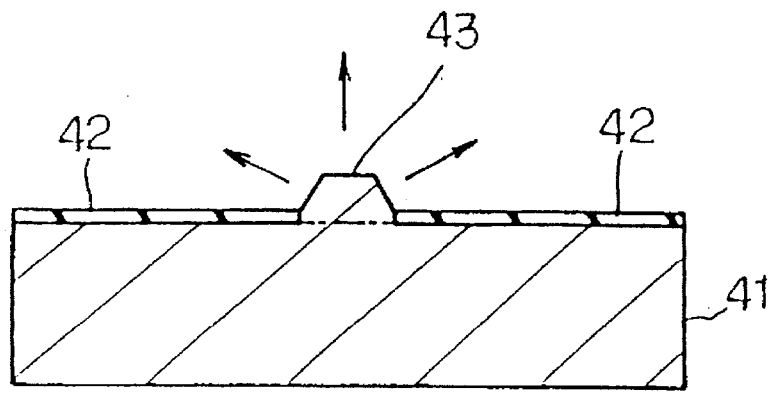
FIGS. 5A to 5C are cross sectional view showing the mesa grown on the exposed center spacing between the insulating masks obliquely extending at least 5 degrees according to the present invention.
Figure 5B:
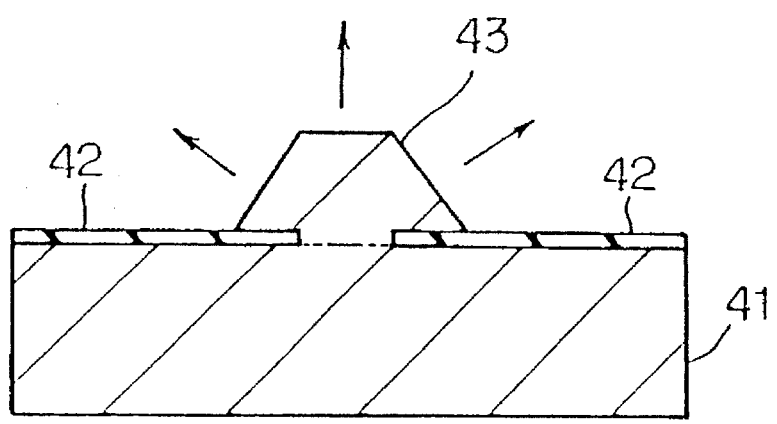
Figure 5C:
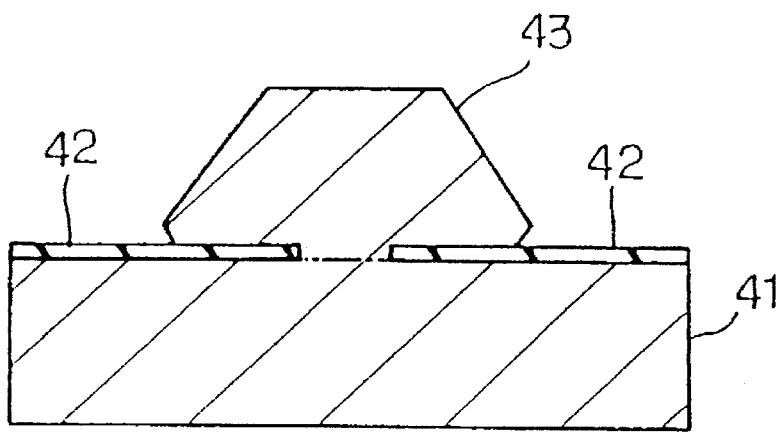
Figure 6:
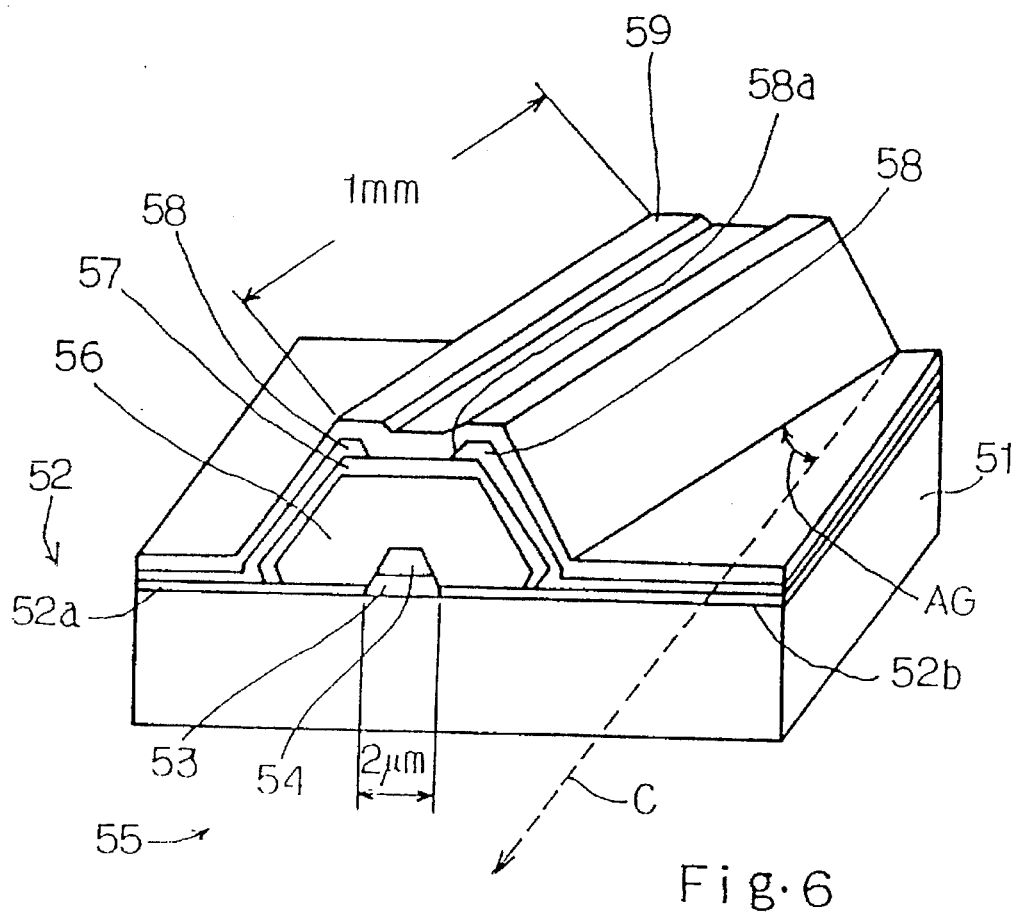
FIG. 6 is a perspective view showing the structure of a semiconductor laser according to the present invention.

Referring to FIG. 6 of the drawings, a semiconductor laser embodying the present invention is fabricated on a substrate 51 of n-type indium phosphide having a major surface with (100) orientation. Arrow C is indicative of [011] direction of the substrate 51.

Figure 7:
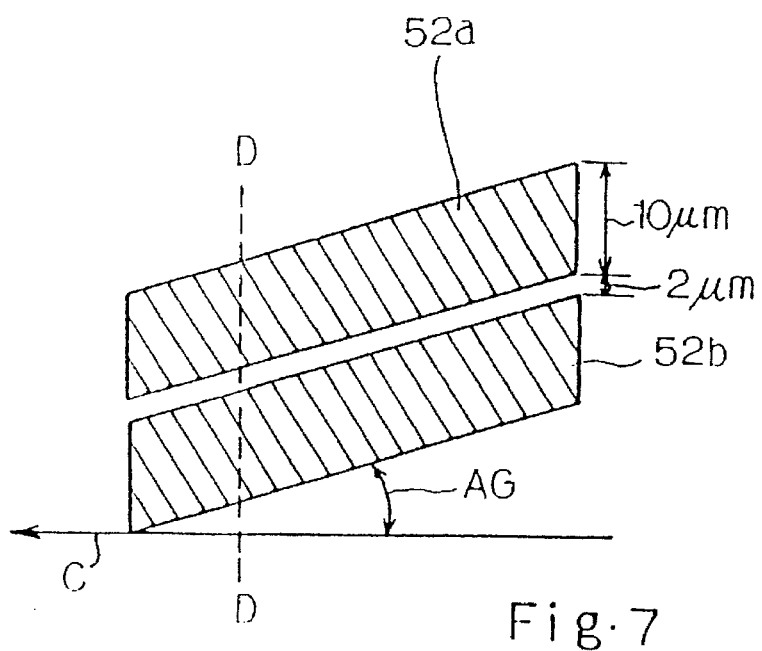
FIG. 7 is a view showing the layout of an insulating mask forming a part of the semiconductor laser.

The semiconductor laser embodying the present invention comprises an insulating mask 52 of silicon dioxide covering the major surface of the substrate 51, and is 1000 angstroms in thickness and 10 microns in width. The insulating mask 52 is split into two halves 52a and 52b spaced apart from each other by 2 microns, and a center spacing between the two halves 52a and 52b obliquely extends at a predetermined angle AG equal to or greater than 5 degrees with respect to [011] direction. The center spacing exposes a part of the major surface of the substrate 51. FIG. 7 illustrates the layout of the insulating mask 52, and the two halves 52a and 52b are hatched for better understanding.

Turning back to FIG. 6, the semiconductor laser embodying the present further comprises a buffer layer 53 of n-type indium phosphide grown over the part of the major surface and a multiple quantum well 54 with 1.48 micron wavelength composition grown over the buffer layer 53. The multiple quantum Well 54 serves as an active layer, and includes six indium gallium arsenide layers each 40 angstroms thick and five indium gallium arsenic phosphide layers each 130 angstroms thick. The buffer layer 53 and the multiple quantum well 54 form in combination a mesa structure 55 having a trapezoid cross section, and the two halves 52a and 52b of the insulating mask 52 are held in contact with both sides of a lower portion of the mesa structure 55.

The semiconductor laser embodying the present invention further comprises a cladding layer 56 of p-type indium phosphide 2.5 microns in height and a cap layer 57 of heavily doped p-type indium gallium arsenide 0.3 micron in thickness. The cladding layer 56 is grown from the mesa structure 55, and extends on an upper surface of the insulating mask 52. For this reason, the cladding layer 56 is not directly held in contact with the substrate 51. The cladding layer 56 has a flat top surface, and the cap layer 57 also form a flat top surface over the flat top surface of the cladding layer 56.

The semiconductor laser embodying the present invention further comprises an insulating layer 58 of silicon dioxide topographically covering the cap layer 57 so as to create a flat top surface over the flat top surface of the cladding layer 56. The insulating layer 58 is 2000 angstroms thick, and a slit 58a is formed in the flat top surface of the insulating layer 58 for exposing the cap layer 57.

The semiconductor laser embodying the present invention further comprises an electrode 59 covering the insulating layer 58 and held in contact with the cap layer 57 through the slit 58a, and the electrode 59 is implemented by a lamination including a gold film of 4000 angstroms thick and a titanium film of 500 angstroms thick.

Though not shown in FIG. 6, another electrode is held in contact with the back surface of the substrate 51. One of the device facet are coated with a reflecting film, and the reflecting film is about 95 per cent in reflectivity. The facets of opposite side are coated with anti-reflective film, and output light is emitted from the anti-reflective facet.

The semiconductor laser thus arranged has a length of the order of 1 millimeter.

In operation, current flows from the electrode 59 through the cap layer 57, the cladding layer 56, the mesa structure 55 and the substrate 51 into the other electrode, and the semiconductor laser oscillator achieves the light output equal to or greater than 50 milli-watt.

The multiple quantum well may be replaced with a bulk active layer with 1.48 micron wavelength composition, and may be regulated to composition for 1.3 micron wavelength or composition for 1.55 micron wavelength.

Figure 8A:
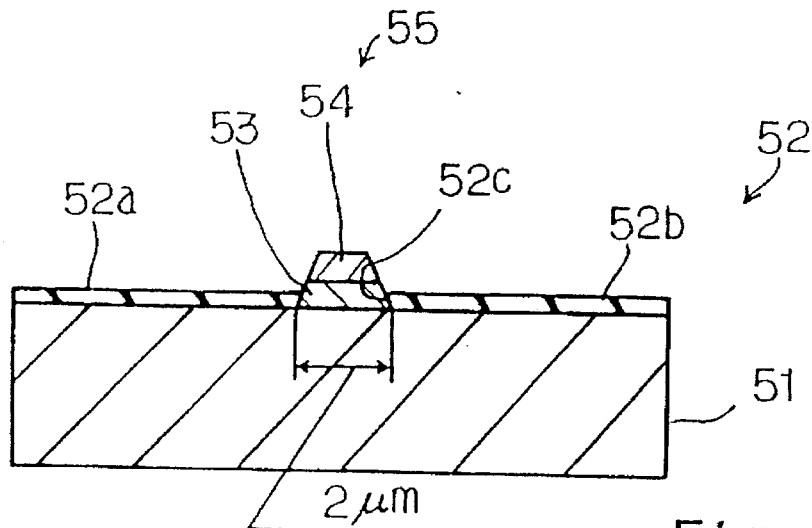
FIGS. 8A to 8C are cross sectional views showing a process sequence for fabricating the semiconductor laser.
Figure 8B:
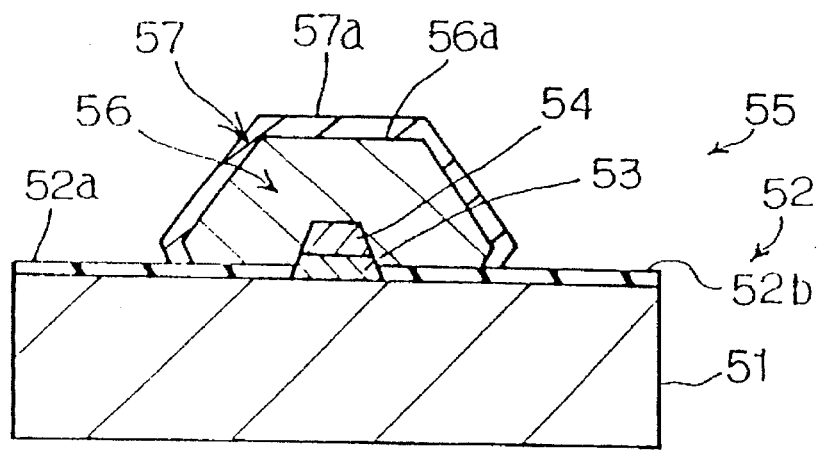
Figure 8C:
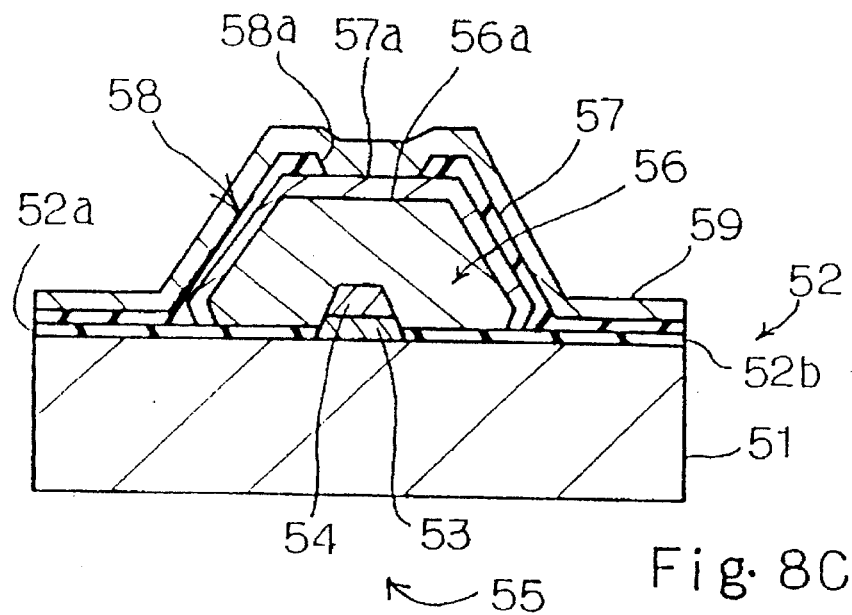

Description is hereinbelow made on a process sequence for fabricating the semiconductor laser according to the present invention with reference to FIGS. 8A to 8C taken along line D—D of FIG. 7. The process starts with preparation of the substrate 51, and silicon dioxide is deposited to 1000 angstroms thick on the major surface of the substrate 51. The silicon dioxide layer is patterned into the insulating mask 52 having the dimensions described in conjunction with the structure of the semiconductor laser, and the center spacing 52c takes between the two halves 52a and 52b at 5 degrees with respect to [011] direction.

N-type indium phosphide, indium gallium arsenide and indium gallium arsenic phosphide are successively grown on the exposed center spacing through an metal organic vapor phase epitaxy. The n-type indium phosphide forms the buffer layer 53, and the six indium gallium arsenide layer and the five indium gallium arsenic phosphide layers alternately laminated on one another form in combination the multiple quantum well 54. Thus, the mesa structure 55 is formed on the exposed area as shown in FIG. 8A.

The metal-organic vapor phase epitaxy further grows the cladding layer 56 of p-type indium phosphide and the cap layer 57 of heavily doped p-type indium gallium arsenic phosphide. The cladding layer 56 buries the mesa structure 55, and extends on the insulating mask 52. The cladding layer 56 reaches 2.5 micron high, and the cap layer is 0.3 micron thick. Even though cap layer 57 projects from the insulating mask layer by 2.8 microns, the cladding layer 56 and the cap layer 57 keep the top surfaces 56a and 57a flat as shown in FIG. 8B, because the mesa structure 55 obliquely extends at 5 degrees with respect to [011] direction.

Silicon dioxide is deposited to 2000 angstroms thick over the entire surface of the structure, and the slit 58a is formed in the passivation film 58 for exposing the flat top surface 57a. Gold and titanium are deposited to 4000 angstroms thick and 500 angstroms thick over the entire surface of the passivation film 58, and the gold film and the titanium film form the electrode 59 through an alloying process. The resultant structure is illustrated in FIG. 8c.

After the substrate 51 is made thinner by back surface etching, an electrode (not shown) is formed on the back surface of the substrate 51. The semiconductor laser are separated from one another through a cleavage step in such a manner as to be 1 millimeter in length.

As will be appreciated from the foregoing description, the injected current flows through the cladding layer 56 to the mesa structure 55 without leakage current, and achieves the large light output. Moreover, the process sequence according to the present invention successively grows the buffer layer 53, the multiple quantum well 54, the cladding layer 56 and the cap layer 57 without partially removing stage for the insulating mask 52. Therefore, only one sequence of MOVPE process is required, while the prior art process require two sequence of MOVPE. In fact, the selective MOVPE is completed within half time period of the prior art process. Finally, the process sequence according to the present invention is good in reproducibility.

Second Embodiment

Figure 9:
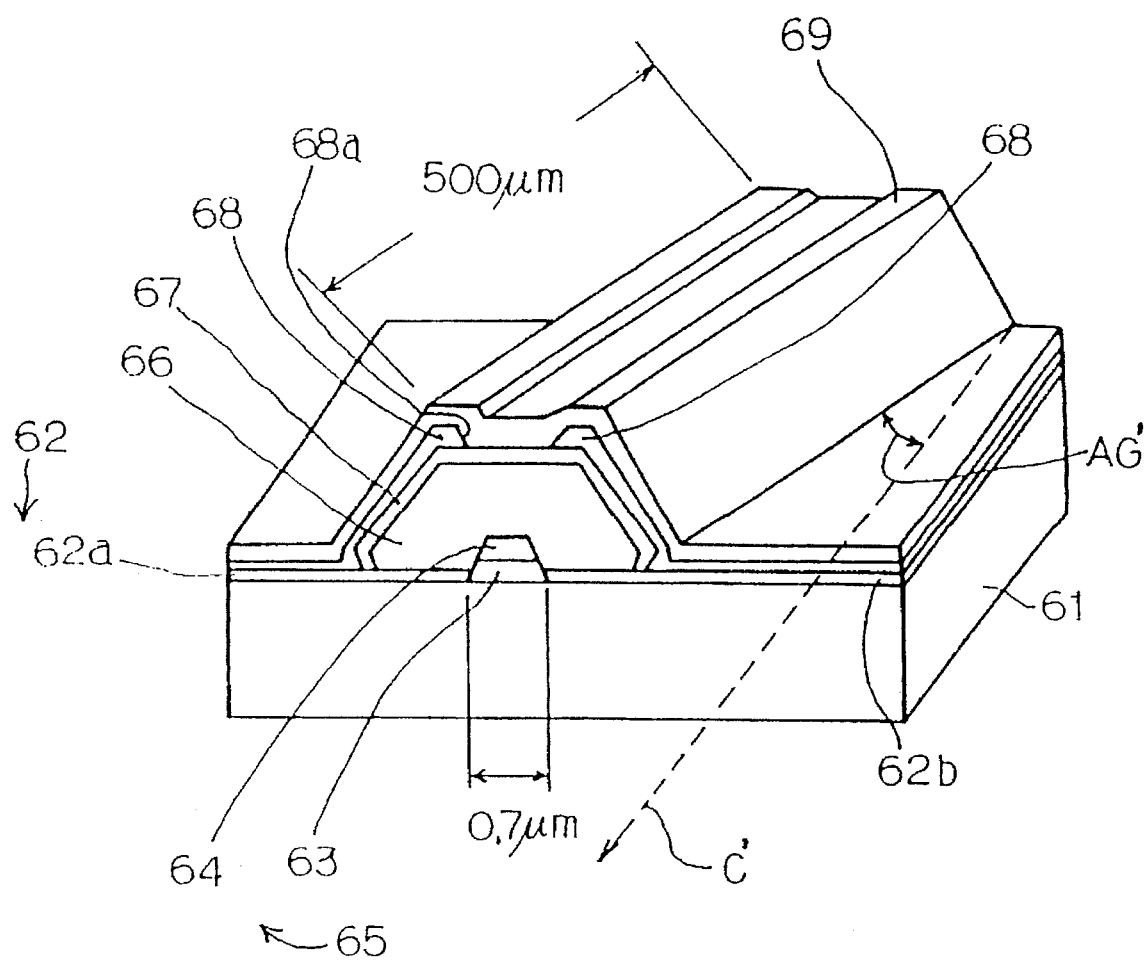
FIG. 9 is a perspective view showing the structure of a semiconductor optical amplifier according to the present invention.

Referring to FIG. 9 of the drawings, a semiconductor optical amplifier or a semiconductor LD amplifier is fabricated on a substrate 61 of n-type indium phosphide. The n-type indium phosphide has a major surface 61a with (100) orientation, and arrow C' is indicative of [011] direction.

Figure 10:
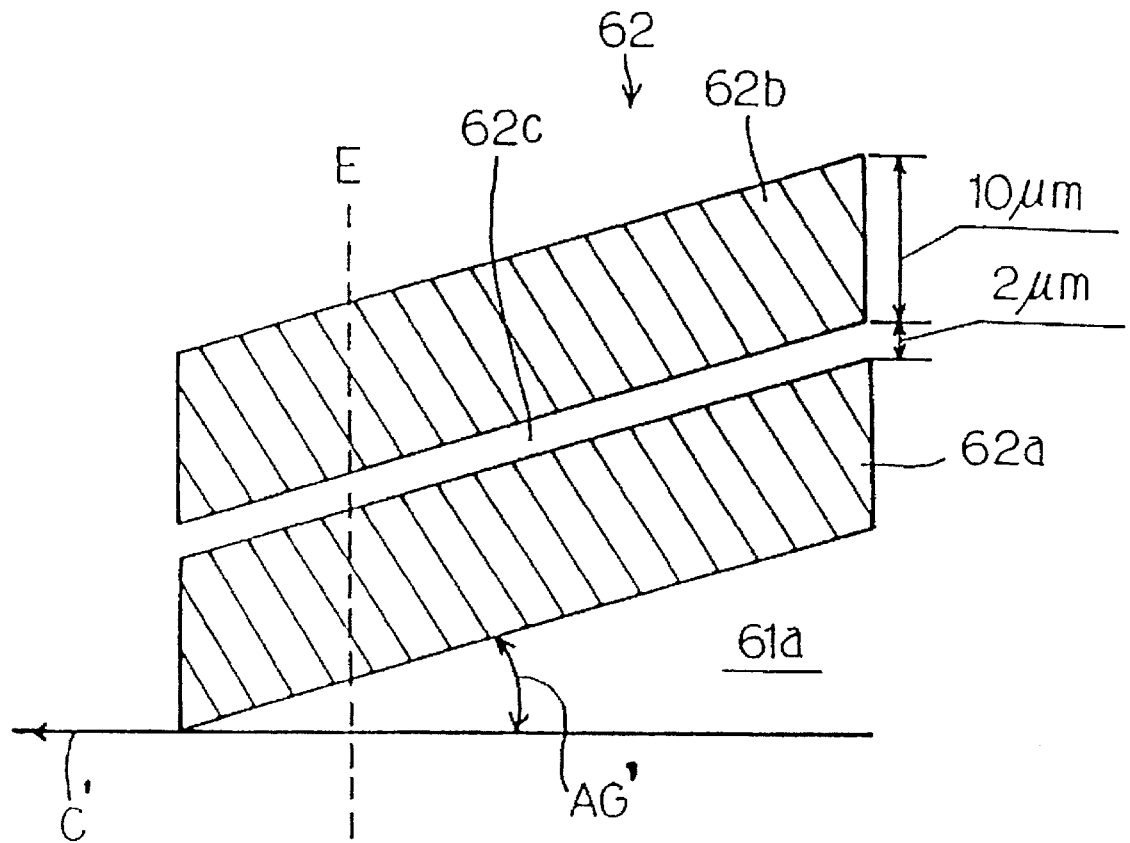
FIG. 10 is a plan view showing the layout an insulating mask incorporated in the semiconductor optical amplifier shown in FIG. 9.

The semiconductor optical amplifier is fabricated through the following process sequence. An insulating mask 62 is provided on the major surface of the substrate 61, and the insulating mask 62 is split into two portions 62a and 62b spaced apart from one another by 0.7 micron as shown in FIG. 10. The portions 62a and 62b are 700 angstroms in thickness and 10 microns in width. The center spacing 62c obliquely extends at 10 degrees with respect to [011] direction, and exposes a part of the major surface 61a of the substrate 61.

Figure 11:
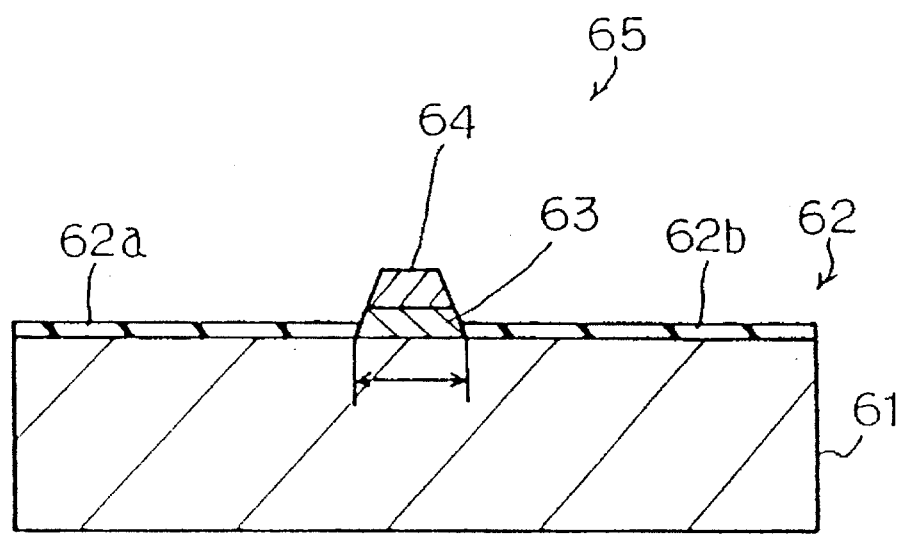
FIG. 11 is a cross sectional view taken along line E—E of FIG. 10 and showing the structure of the semiconductor optical amplifier.

A buffer layer 63 of n-type indium phosphide and an active layer 64 of indium gallium arsenic phosphide are grown on the exposed center spacing 62c through a metal organic vapor phase epitaxy as shown in FIG. 11. The indium gallium arsenic phosphide is regulated to a predetermined composition for 1.3 micron wavelength, and is 3000 angstroms thick. The active layer 64 is 5000 angstroms wide at the intermediate point of the thickness, and the buffer layer 63 and the active layer 64 form in combination a mesa structure 65. The portions 62a and 62b are held in contact with the lower portion of the buffer layer 63.

As similar to the first embodiment, a cladding layer 66 of p-type indium phosphide and a cap layer 67 of heavily doped p-type indium gallium arsenide are continuously grown over the mesa structure 65 through the metal organic vapor phase epitaxy (see FIG. 9 again). The cladding layer 66 extends on the insulating mask 62, and is not directly contact with the major surface 61a.

Although the cladding layer 66 is 1.5 micron high and the cap layer 67 is 0.3 micron thick, the top surfaces thereof are flat, because angle AG' is not less than 5 degrees.

Silicon dioxide is topographically deposited to 2000 angstroms over the entire surface of the structure for forming an insulating layer 68, and a slit 68a is formed in the top surface of a passivation film 69 for exposing the flat top surface of the cap layer 67. Gold and titanium are deposited to 4000 angstroms thick and 500 angstroms thick over the entire surface of the structure, and the gold film and the titanium film are formed into an electrode 69 through an alloying technique.

The back surface of the substrate 61 is ground, and, thereafter, an electrode is provided on the ground back surface. The semiconductor light amplifiers are separated through a cleavage, and the device length is regulated to 500 microns.

In operation, current was injected through the cladding layer into the active layer 64, and the semiconductor optical amplifier achieved more than 25 dB for an incident light with 1.31 micron wavelength under 200 milliamperes.

The active layer 64 may be formed of indium gallium arsenic phosphide with 1.55 micron wavelength composition for incident light with 1.55 micron wavelength.

As will be appreciated from the foregoing description, the semiconductor light amplifier achieves a large gain, because the current flows into the active layer without leakage current into the substrate 61, and the process sequence is simpler than the prior art process. The process sequence according to the present invention is good in reproducibility.

Third Embodiment

Figure 12:
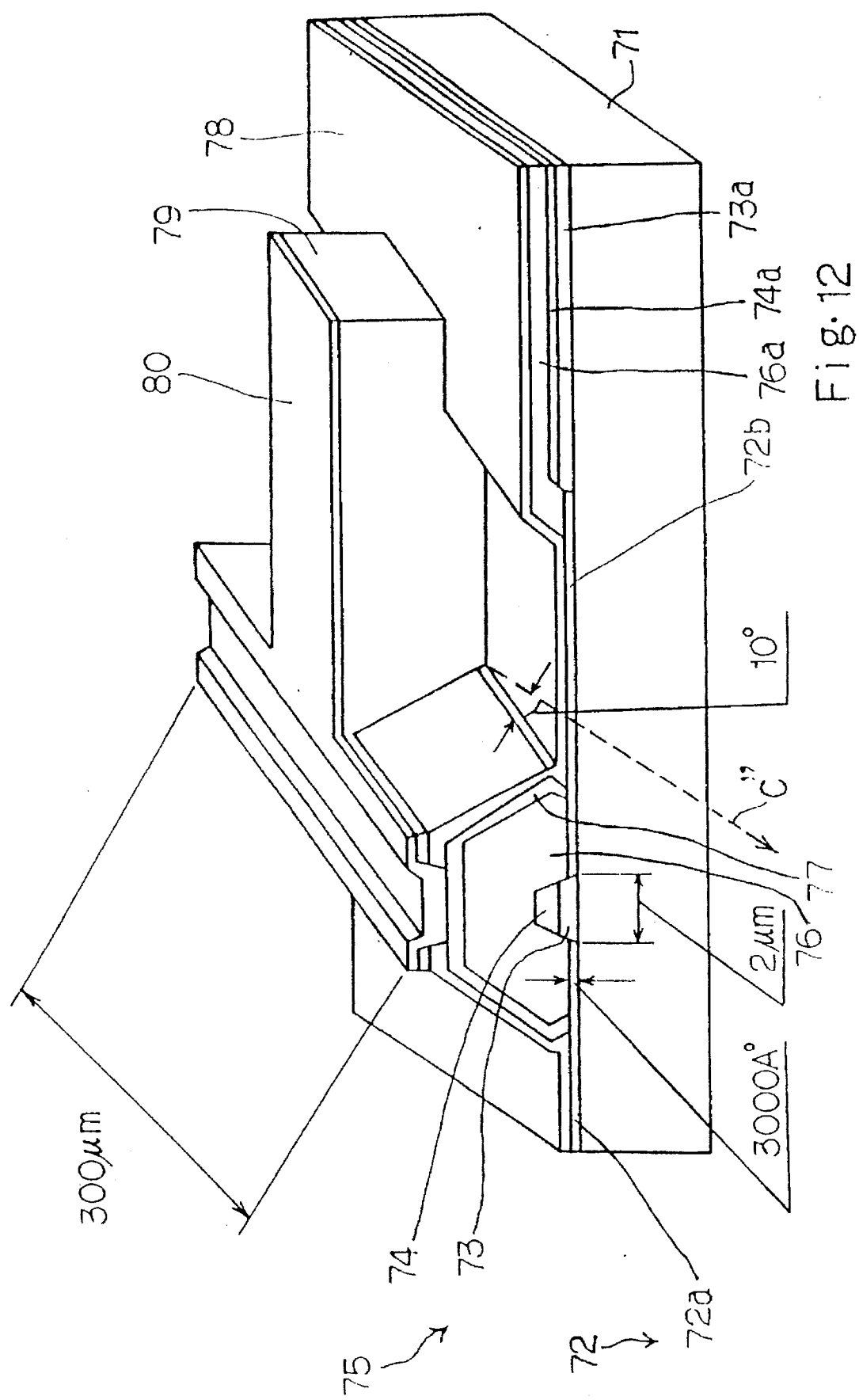
FIG. 12 is a perspective view showing the structure of electroabsorption optical modulator according to the present invention.

Referring to FIG. 12 of the drawings, a electroabsorption optical modulator embodying the present invention is fabricated on a substrate 71 of n-type indium phosphide. The indium phosphide crystal has (100) surface serving as a major surface of the substrate 71.

Figure 13A:
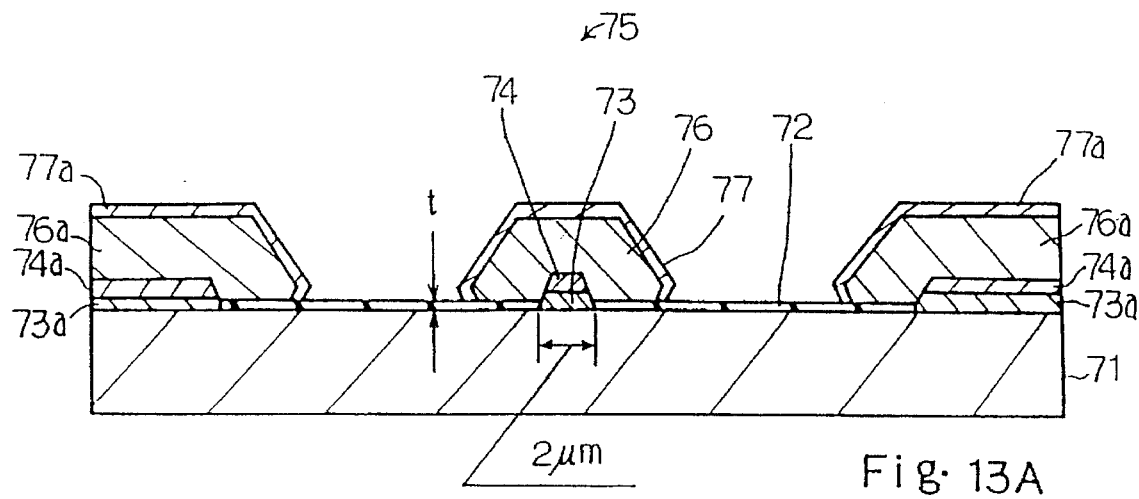
FIGS. 13A to 13C are cross sectional view showing a process sequence for fabricating the modulator shown.
Figure 13B:
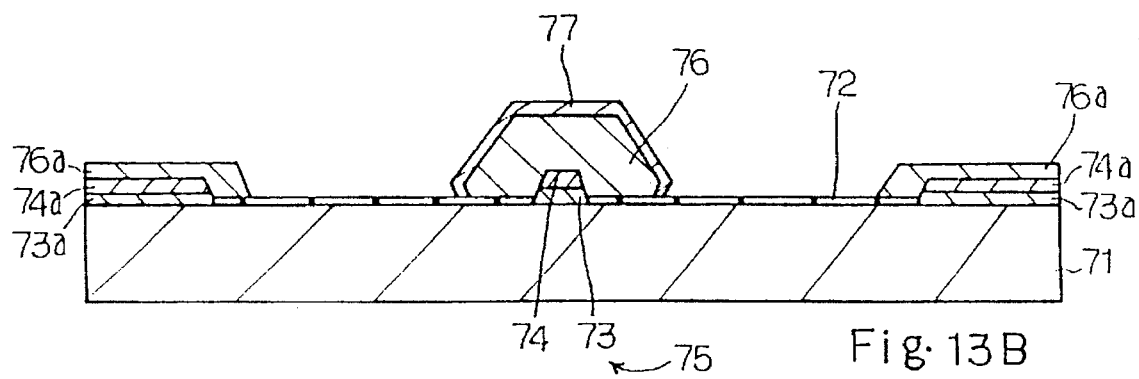
Figure 13C:
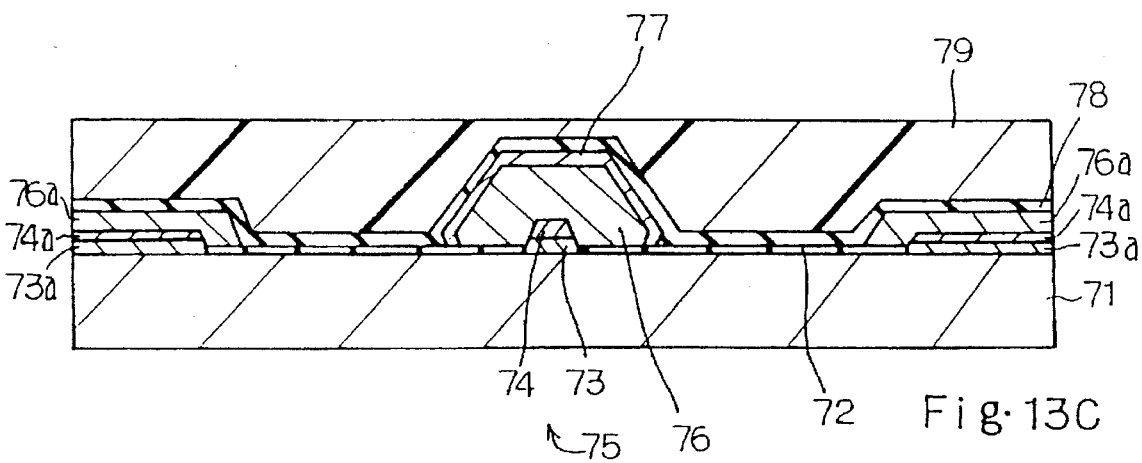

The structure of the electroabsorption optical modulator will be understood through description on a process sequence with concurrent reference to FIGS. 13A to 13C.

First, an insulating mask 72 is provided on the major surface, and is split into two portions 72a and 72b spaced apart from one another by a 2 micron wide center spacing. The two portions 72a and 72b are 3000 angstroms in thick and 15 microns wide. The center spacing obliquely extends at 10 degrees with respect to [011] direction indicated by arrow C".

Using a metal organic vapor phase epitaxy, a buffer layer 73 of n-type indium phosphide and an optical absorbing layer 74 are successively grown on the exposed area of the major surface of the substrate 71. The optical absorbing layer 74 is 2500 angstroms thick, and the indium gallium arsenic phosphide is regulated to the 1.45 micron wavelength composition. The buffer layer 73 and the optical absorbing layer 74 form a mesa structure 75.

The metal organic vapor phase epitaxy further grows a cladding layer 76 of p-type indium phosphide and a cap layer 77 of heavily doped p-type indium gallium arsenide over the mesa structure 75, and the insulating mask 72 prevents the cladding layer 76 and the substrate 71 from direct contact. The cladding layer 76 is 1.5 micron high, and the cap layer 77 is 0.3 micron thick. However, the cladding layer 76 and the cap layer 77 keep the top surfaces thereof flat, because the mesa structure 75 is grown on the exposed center spacing declining at more than 5 degrees with respect to [011] direction.

While the buffer layer 73, the optical absorbing layer 74, the cladding layer 76 and the cap layer 77 are growing through the metal organic vapor phase epitaxy, an n-type indium phosphide layer 73a, an indium gallium arsenic phosphide layer 74a, a p-type indium phosphide layer and a heavily doped p-type indium gallium arsenide layer are simultaneously grown on the major surface outside of the insulating mask 72 as shown in FIG. 13A.

These layers 76a to 77a are etched away by at least 1 micron thick as shown in FIG. 13B. Silicon dioxide is deposited over the entire surface of the structure to 2000 angstroms thick so as to form a passivation layer 78, and the passivation layer 78 is coated with polyimide 79 as shown in FIG. 13C.

The polyimide layer 79 and the passivation layer 78 are partially removed to expose the flat top surface of the cap layer 77, and gold and titanium are deposited to 4000 angstroms and 500 angstroms over the entire surface of the structure. The gold film, the titanium film and the polyimide layer 79 are patterned as shown in FIG. 12.

The gold film and the titanium film are formed into an electrode 80 through an alloying step. The substrate is made thinner by back surface etching. An electrode (not shown) is formed on the back surface, and the semiconductor optical modulator with a device length of 300 microns is separated through a cleavage. An anti-reflective film (not shown) covers the device facets.

The electroabsorption optical modulator embodying the present invention achieved the extinction ratio at 20 dB, the optical loss at 3 dB and the modulation band width of 5 GHz. When the electroabsorption optical modulator was coupled to an optical fiber, the coupling loss was 2.5 dB.

In this instance, the insulating mask 72 was 3000 angstroms thick. However, if the insulating mask 72 of silicon dioxide is not less than 2000 angstroms, the modulation bandwidth of 2.4 GHz is achievable.

The optical absorbing layer 74 may be replaced with a multiple quantum well structure implemented by an alternately laminated six indium gallium arsenide layers each 30 angstroms thick and five indium gallium arsenic phosphide layers with 1.3 micron wavelength composition each 130 angstroms thick. The structure is of oscillating wavelength of 1.45 microns composition.

As will be understood from the foregoing description, the insulating mask layer 72 prevents the substrate 71 from leakage current from the cladding layer 76, and the thick insulating mask 72 decreases the parasitic capacitance not greater than 1 pF. As a result, the electroabsorption optical modulator according to the present invention achieves the good performances.

Moreover, the process sequence according to the present invention grows the buffer layer 73 to the cap layer 77 through a single metal organic vapor phase epitaxy, and, for this reason, is simpler than the prior art process sequence without sacrifice of reproducibility.

Although particular embodiments of the present invention have been shown and described, it will be obvious to those skilled in the art that various changes and modifications may be made without departing from the spirit and scope of the present invention. The selectively growing technology is not limited to the metal organic vapor phase epitaxy, and the compound semiconductor materials used for the semiconductor optical device may be in a different system. The semiconductor optical devices according to the present invention may be fabricated on p-type semiconductor substrates by changing the dopant impurities of the compound semiconductor layers to the opposite type to those of the semiconductor optical devices described hereinbefore.

The insulating mask layers, the insulating layers and the passivation layer may be formed of PSG or SiON.

What is claimed is:

1. A semiconductor optical device fabricated on a semiconductor substrate, comprising at least:
    a) an insulating mask covering a surface of said semiconductor substrate and having a stripe spacing exposing a part of said surface, said insulating mask having an upper surface, and said insulating mask being formed of a substance and having a thickness such that said semiconductor optical device has a parasitic electrical capacitance not greater than 2 pF;
    b) a semiconductor mesa structure having a lower portion, said semiconductor mesa structure being grown epitaxially over said part of said surface so that said insulating mask layer is held in contact with said lower portion of said semiconductor mesa structure, said mesa structure comprising a light absorbing layer for modulating an incident light;
    c) a cladding layer grown epitaxially from said semiconductor mesa structure, and extending over said upper surface of said insulating mask; and
    d) a cap layer grown epitaxially which covers said cladding layer.

2. The semiconductor optical device as set forth in claim 1, in which said insulating mask layer is of silicon dioxide and thicker than 2000 angstroms.

* * * * *